United States Patent
Kawate et al.

(10) Patent No.: US 6,265,460 B1
(45) Date of Patent: Jul. 24, 2001

(54) HOT-MELT ADHESIVE COMPOSITION, HEAT-BONDING FILM ADHESIVE AND ADHERING METHOD USING HOT-MELT ADHESIVE COMPOSITION

(75) Inventors: Kohichiro Kawate, Tokyo; Shigeyoshi Ishii, Kanagawa, both of (JP); Mario A. Perez, Burnsville, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 09/355,602

(22) PCT Filed: Jun. 15, 1999

(86) PCT No.: PCT/US99/13468
§ 371 Date: Jul. 30, 1999
§ 102(e) Date: Jul. 30, 1999

(87) PCT Pub. No.: WO00/00566
PCT Pub. Date: Jan. 6, 2000

(30) Foreign Application Priority Data

Jun. 29, 1998  (JP) .................................... 10-182091

(51) Int. Cl.⁷ ................ C08F 2/46; C08L 63/08
(52) U.S. Cl. .............. 522/31; 522/66; 522/100; 522/109; 522/111; 522/122; 522/182; 156/273.3; 156/275.7; 156/330
(58) Field of Search .................... 522/100, 103, 522/109, 110, 111, 122, 182, 31, 66; 525/208; 156/273.3, 275.5, 275.7, 330

(56) References Cited

U.S. PATENT DOCUMENTS

| 4,401,537 | 8/1983 | Chern et al. . |
|---|---|---|
| 4,855,363 | * 8/1989 | Moteki ................ 525/208 |
| 5,418,288 | 5/1995 | Kawasaki et al. . |
| 5,709,948 | 1/1998 | Perez et al. . |
| 5,721,289 | 2/1998 | Karim et al. . |

FOREIGN PATENT DOCUMENTS

| 0 620 259 A2 | 10/1994 | (EP) . |
|---|---|---|
| 0 721 975 A1 | 7/1996 | (EP) . |
| 63230781 | 9/1988 | (JP) . |
| 4045123 | 2/1992 | (JP) . |
| 5320608 | 12/1993 | (JP) . |
| 6158017 | 6/1994 | (JP) . |
| 6172731 | 6/1994 | (JP) . |
| 6306346 | 11/1994 | (JP) . |
| 10-316955 | * 12/1998 | (JP) . |
| WO 97/16500 | 5/1997 | (WO) . |

OTHER PUBLICATIONS

Full Machine Assisted Translation of JP 10–316955 A, Derwent, Dec. 1998.*
Database WPI Section Ch, Week 9007, Derwent Publication Ltd., London, GB; Class A17, AN 1999–076686 XP002117222 & JP 10 316955 A (Minnesota Mining & Mfg. Co.), Abstract, Dec. 2, 1998.

* cited by examiner

Primary Examiner—Michael W. Ball
Assistant Examiner—Michael A. Tolin
(74) Attorney, Agent, or Firm—Alan Ball; G. F. Chernivec; G. L. Griswold

(57) ABSTRACT

A hot-melt adhesive composition, which has a high curing rate, requires no water for a curing reaction or no solvent for the formation of a film, has good storage stability, and is suitable for adhering electronic parts or producing integrated circuit (IC) packages is provided. Specifically, a thermosetting hot-melt adhesive composition comprising a polyethylene copolymer having epoxy groups in a molecule as an epoxy component, which further comprises a cationic polymerization catalyst, is provided herein. Also disclosed are heat-bonding film adhesives and adhering methods using the hot-melt adhesive composition.

9 Claims, No Drawings

HOT-MELT ADHESIVE COMPOSITION, HEAT-BONDING FILM ADHESIVE AND ADHERING METHOD USING HOT-MELT ADHESIVE COMPOSITION

FIELD OF THE INVENTION

The present invention relates to a hot-melt adhesive composition, a heat-bonding film adhesive, and a bonding method using a hot-melt adhesive composition, which are suitable for adhering electronic parts or producing integrated circuit (IC) packages. The adhesive composition of the present invention can be used as a reactive (thermosetting) thermal adhesion type adhesive.

BACKGROUND OF THE INVENTION

So-called reactive (thermosetting) hot-melt adhesives, which can be cured (crosslinked) after adhesion for improving properties such as heat resistance, are available as a kind of so-called hot-melt adhesives that can be used for thermal adhesion. The following adhesives 1) through 6) are exemplified as conventional reactive hot-melt adhesives:

1) Moisture-curing hot-melt adhesives comprising polymers having an isocyanate group (see U.S. Pat. No. 5,418,288 corresponding to JP-A-6-158017);
2) Silanol-condensing hot-melt adhesives comprising polymers having a silyl group (see JP-A-5-320608, etc.);
3) Radical-polymerization hot-melt adhesives comprising polymers having an acryloyl group (see JP-A-63-230781);
4) Thermosetting hot-melt adhesives comprising polymers having a glycidyl group and phenol resins (see JP-A-617273 1);
5) Hot-melt adhesives that are crosslinked by irradiation after thermal adhesion (see JP-A-6-306346); and
6) Crosslinkable resin compositions comprising a terpolymer of ethylene, an α, β-unsaturated carboxylic acid, and an α, β-unsaturated carboxylate ester; a copolymer of ethylene and glycidyl methacrylate; and a diallyl phthalate compound as a crosslinking agent (see JP-A4-45123).

Furthermore, U.S. Pat. Nos. 4,401,537; 5,709,948; and 5,721,289 disclose polymerizable compositions comprising an epoxy resin as an epoxy component, a cationic polymerization catalyst, and other components, that can be polymerized by polymerization procedures, including the irradiation of light such as ultraviolet (UV) rays, etc. Those compositions can be used as adhesives that are curable with light-irradiation because the cationic polymerization catalyst, which has been activated with light-irradiation, greatly increases the reaction rate of the epoxy resin. Examples of the other components are free radically polymerized polymers such as acrylic polymers that are disclosed in U.S. Pat. No. 5,721,289; thermoplastic polyolefins that are disclosed in U.S. Pat. No. 5,709,948; and the like. The above compositions can be used as curable adhesives (U.S. Pat. No. 5,721,289) and photocurable adhesives (U.S. Pat. No. 4,401, 537), that have good reactivity.

Hot-melt adhesives containing polyethylene copolymers as adhesive components are desirably used in the electrical field. Such polyethylene type hot-melt adhesives are chemically stable, and their stability is proved by a test under severe conditions, for example, a pressure cooker test that is used to test semiconductor products. However, conventional polyethylene type hot-melt adhesives are not designed to perform a crosslinking reaction (curing reaction) between molecules of polyethylene copolymers. Thus, they have low heat resistance and cannot exert a sufficient bonding force at a temperature higher than a bonding temperature as can be readily understood from the adhesion mechanism of hot-melt adhesives. Such low heat resistance particularly limits the application of hot-melt adhesives in the electrical field. For example, when such adhesives are used as adhesion tapes to fix lead pins of IC lead frames, the tapes cannot be used in such conditions that the tapes are thermocompressed at a temperature of about 180° C. and dipped in a solder bath, followed by maintaining them in a hot atmosphere of 230 to 260° C.

The above conventional reactive hot-melt adhesives 1) through 6) still have one or more of the following drawbacks a) through g):

a) Some hot-melt adhesives have a low crosslinking rate and require a long post cure time (for example, the above adhesives 1) and 2));
b) A certain hot-melt adhesive requires moisture for the crosslinking reaction, and is less suitable for adhering parts that are hardly in contact with air (for example, the above adhesive 1));
c) A certain hot-melt adhesive generates water as a byproduct, which has adverse affects, such as deterioration of adhesion strength with time (for example, the above adhesive 2));
d) Some hot-melt adhesives require a solvent for forming them in the form of a film and the residual solvent may have adverse effects after the completion of adhering (for example, the above adhesives 1) to 4));
e) In some hot-melt adhesives, the crosslinking reaction gradually proceeds when they are stored even at room temperature (about 25° C.) and, therefore, they have low storage stability (for example, the above adhesives 1), 2) and 3));
f) Radiation-crosslinking adhesives are less suitable for adhering parts that cannot be or are hardly irradiated (for example, the above adhesive 5)); and
g) Some adhesives (or compositions) require curing components such as curing agents that are contained in an originally active state. Thus, it is difficult to prevent gelation of such adhesives or compositions caused by heating during the step of processing them in a desired form such as a film and, therefore, they cannot be continuously produced (for example, the above adhesives 4) and 6)).

The above described epoxy resins are usually liquids at room temperature (around 25° C.). Some epoxy resins are solids that can be liquefied by heating, but their flowability (for example, properties such as MFR, which will be explained later) under heated conditions is relatively large. Thus, an epoxy resin alone cannot be used as a hot-melt adhesive.

In addition, the high reactivity of epoxy resins makes it difficult to maintain both thermal curability and flowability while being heated of the compositions comprising the epoxy resins at high levels and to use the compositions as hot-melt adhesives. Furthermore, the epoxy resins tend to be separated from other components when the compositions comprising the epoxy resins are press adhered at a high temperature as hot-melt adhesives. Also, there is the fear of outgassing. The separated epoxy resins may lead to excessive flowability, low adhesion force, contamination of adherents, pollution of environment, and the like. When the epoxy resins are separated, the elasticity of the compositions cannot be sufficiently increased after the compositions are thermally cured.

Furthermore, the above resin composition comprising an epoxy resin and a cationic polymerization catalyst does not contain a polyethylene copolymer as an essential component and, therefore, has less chemical stability than the above polyethylene-type hot melt adhesives.

Thus, the object of the present invention is to provide a hot-melt adhesive composition, which can help solve the problems a) through g) associated with the above conventional reactive hot-melt adhesive compositions, the problems associated with the above compositions comprising the epoxy resin when used as the hot-melt adhesives, and also the problems associated with the conventional polyethylene type hot melt adhesives at the same time.

SUMMARY OF THE INVENTION

To solve the above problems, the present invention provides a thermosetting hot-melt adhesive composition comprising a polyethylene copolymer having epoxy groups in a molecule as an epoxy component. The composition further comprises a cationic polymerization catalyst, a heat-bonding film adhesive comprising a hot coating film of the thermosetting hot-melt adhesive composition that has been activated by irradiation with UV rays, and an adhering method using the hot coating film.

The hot-melt adhesive composition (which may be simply referred to as "adhesive composition") is chemically stable since it contains a polyethylene copolymer as an essential component. In addition, this composition has good heat resistance since it cures through the intermolecular crosslinking reaction of the polyethylene copolymer having epoxy groups.

The hot-melt adhesive composition of the present invention does not contain a curing agent that is originally in the activated state. Thus, the adhesive composition is stable against heat and can be formed into a film by hot-melt coating without gelation of the composition caused by heat. Therefore, a heat-bonding film adhesive and a hot-melt film can be continuously produced easily. The obtained film can solve the above problem f), since it can be thermally cured at a temperature of 120° C. or higher after being activated with the UV irradiation and, thus, it can be thermally cured without the necessity of radiation-crosslining after adhesion like the conventional thermosetting heat-bonding film adhesive or hot-melt film.

Furthermore, the composition of the present invention may be used as a thermally curable hot-melt adhesive after irradiation of UV rays, since it contains a polyethylene copolymer having epoxy groups in a molecule as an epoxy component. That is, the polyethylene copolymer having epoxy groups in a molecule improves flowability and thermal curability of the composition in the hot-melt state after the irradiation of UV rays. In addition, problems associated with the separation of epoxy resins (excessive flowability, low adhesion force, etc.) and the problem of outgassing can be solved. Accordingly, it is preferable that the epoxy component contains substantially no epoxy resins, but essentially consists of a polyethylene copolymer having epoxy groups.

DETAILED DESCRIPTION OF THE PREFERRED EMBODIMENTS OF THE INVENTION

Hot-melt Adhesive Composition

The hot-melt adhesive composition of the present invention is in the solid state at room temperature (about 25° C.) prior to and after activation with UV rays, but can be thermocompressively adhered at a specific temperature under a relatively low pressure in a short time (for example, at a temperature between 100 and 200° C. and under pressure between 0.1 and 40 kg/cm$^2$ for 0.1 to 30 seconds).

After activation with UV rays, the adhesive composition can be cured (or crosslinked) by heating during the thermocompressive adhering or heating after the thermocompressive adhering (post-curing) in the absence of moisture. Thus, the adhesive composition can be used as a heat-bonding thermosetting type adhesive. In such a case, the above described drawbacks, which appear in the radiation-crosslinkable and moisture-curable (crosslinkable) hot-melt adhesives, can be overcome.

A heating temperature for thermosetting is 120° C. or higher. The thermosetting reaction is substantially a reaction between the epoxy groups of an ethylene-glycidyl (meth) acrylate copolymer. Thus, no reaction by-products, such as water, generate. Such a reaction can be effectively catalyzed by a cationic polymerization catalyst.

The adhesive composition of the present invention melts at a temperature of, for example, 120° C. or higher, and can be easily hot-melt coated without gelation. The composition has relatively high flowability in the hot-melt state and, thus, requires no solvent for coating or forming it into a film.

The adhesive composition, after UV ray activation, may be thermally cured at a temperature lower than 120° C., or used as a room temperature-curable hot-melt adhesive, if it is not necessary to shorten the curing time, since the composition is gradually cured, even at room temperature (about 25° C.).

The modulus of the adhesive composition, which is usually expressed by a storage modulus G', after the completion of adhesion (that is, after the completion of the curing reaction) is usually at least 10$^6$ dyne/cm$^2$, preferably at least 10$^7$ dyne/cm$^2$, at 280° C.

When the modulus is less than 10$^6$ dyne/cm$^2$, solder reflow resistance deteriorates, so that the adhesive composition may not be suitable for the adhesion of electronic parts or the production of IC packages. When the modulus is too low, wire bonding may not be satisfactorily carried out.

The above modulus is defined as follows: A sample of the adhesive composition (e.g., a film adhesive, etc.) after UV ray irradiation is heated from 80° C. to 280° C. at a heating rate of 5° C./min. with a dynamic viscoelastometer. The above modulus is a value measured at 280° C. at a shear rate of 6.28 rad/sec.

The adhesive composition of the present invention has very high thermal stability prior to UV ray activation. Thus, it can be processed in the form of a film by melt coating or extrusion molding at a relatively high temperature. The curing reaction between molecules of the polyethylene copolymers is very mild at a heating temperature during such processing and, thus, the adhesive composition does not gel, or its viscosity (complex modulus) does not increase to a level at which continuous production becomes difficult. Furthermore, storage stability of the adhesive composition can be improved, since the curing reaction does not substantially proceed at a temperature lower than 90° C. prior to UV ray activation. Even after UV ray activation, the adhesive composition can be stored at a temperature of 30° C. or less, and can be used as a thermosetting adhesive for about one month.

The adhesive composition of the present invention contains a thermoplastic polymer having no epoxy group in the molecules as an essential component in addition to the polyethylene copolymer having epoxy groups in a molecule.

Therefore, adhesion properties of the adhesive composition after irradiation of UV rays can be easily increased. Such thermoplastic polymers are preferably polyethylene copolymers having no epoxy group in the molecules, in particular, ethylene-alkyl acrylate copolymers, such as ethylene-ethyl acrylate copolymers. Such polyethylene copolymers have high compatibility with polyethylene copolymers having an epoxy group in a molecule and can effectively improve the thermocompressive adhesion or melt-coating properties of the adhesive composition without deteriorating the adhesion properties.

The amount of the polyethylene copolymer having an epoxy group in a molecule is usually from 40 to 80 wt. %, preferably from 45 to 75 wt. % of the whole weight of the composition. Correspondingly, the amount of the thermoplastic polymer having no epoxy group in the molecules is usually from 15 to 55 wt. %, preferably from 24 to 50 wt. % of the whole weight of the composition. When the amount of the thermoplastic polymer is too low, the above effects may not be attained. When the amount of the thermoplastic polymer is too large, the reactivity (heat curability) tends to deteriorate.

The adhesive composition of the present invention may contain polymers other than the above two kinds of polyethylene copolymers insofar as the effects of the present invention are not impaired.

The adhesive composition can be usually prepared by mixing raw materials with a kneading or mixing apparatus until they are substantially uniformly mixed. Such an apparatus may be a conventional kneading or mixing apparatus such as a kneader, a roll mill, an extruder, a planetary mixer, a homo-mixer, and the like.

A mixing temperature and time are selected so that reaction of the polyethylene copolymer does not substantially proceed. Usually, the temperature is between 20 and 120° C. and the time is between 1 minute and 2 hours.

Polyethylene Co-polymer and Thermoplastic Polymer

The polyethylene copolymer having epoxy groups in a molecule may be, for example, an ethylene-glycidyl (meth) acrylate copolymer. The ethylene-glycidyl (meth)acrylate copolymer (hereinafter sometimes referred to as "copolymer (a)") is cured when the adhesive composition after UV ray activation is heated at a specific temperature and serves to increase cohesive force of the cured material. Such a high cohesive force is advantageous for improving adhesion properties, such as peel strength, of the adhesive composition.

Copolymer (a) also serves to melt the precursor of the adhesive composition at a relatively low temperature and to facilitate melt coating of the composition. Furthermore, copolymer (a) provides the adhesive composition with good thermal adhesion properties, which means adhesion properties against an adherent after the composition is molten and in contact with the adherent, cooled, and solidified.

Copolymer (a) may be prepared by polymerizing a monomer mire containing:

i) a glycidyl (meth)acrylate monomer, and
ii) an ethylene monomer.

In addition to the above monomers, other monomers such as propylene, an alkyl (meth)acrylate, vinyl acetate, and the like may be used, insofar as the effects of the present invention are not impaired. In this case, the alkyl group of the alkyl (meth)acrylate has 1 to 8 carbon atoms.

Preferable examples of copolymer (a) are:

1. Copolymers of glycidyl (meth)acrylate and ethylene;
2. Terpolymers of glycidyl (meth)acrylate, vinyl acetate and ethylene; and
3. Terpolymers of glycidyl (meth)acrylate, ethylene and an alkyl (meth)acrylate.

Such copolymers usually contain at least 50 wt. %, preferably at least 75 wt. % of repeating units formed by the polymerization of the monomer mixture of glycidyl (meth) acrylate and ethylene, based on the whole copolymer.

The weight ratio of the glycidyl (meth)acrylate (G) to ethylene (E) (G:E) in the above repeating units is usually between 50:50 and 1:90, preferably between 20:80 and 5:95. The copolymers (a) may be used independently or as a mixture of two or more.

The flowability of the polyethylene copolymer having epoxy groups in a molecule and the thermoplastic polymer having no epoxy group in the molecules such as a polyethylene copolymer having no epoxy group, which are used in the composition of the present invention, while being heated can be determined in accordance with conditions for hot-melt coating (e.g., temperature, coating methods, etc.). For example, the melt flow rate (MFR) at 190° C. of the polyethylene copolymer is usually in the range between 1 and 1,000 g/10 min., preferably in the range between 10 and 700 g/10 min., in particular in the range between 100 and 500 g/10 min.

Herein, "MFR" is a value measured according to JIS K 6760. The weight average molecular weight of the polyethylene copolymer is so selected that MFR is in the above range. When MFR is too low, it may be difficult to continuously produce a heat-bonding film adhesive or a hot-melt film having a desired thickness. When MFR is too high, the composition flows excessively during the heat-bonding adhering operation and, thus, it flows out from the gap between the adherents, or the thickness of the adhesive layer becomes too small so that the adhesion performance tends to deteriorate.

The total amount of the polyethylene copolymer having epoxy groups in a molecule and the polyethylene copolymer having no epoxy group in the molecules is preferably between 50 and 99.9 wt. % of the whole adhesive composition. When the total amount of the polyethylene copolymers is too low, the modulus of the adhesive composition after thermosetting tends to decrease. When the total amount of the polyethylene copolymers is too high, the reactivity tends to deteriorate.

Cationic Polymerization Catalyst

The cationic polymerization catalyst is a compound that generates a cationic active species such as a Lewis acid upon irradiation with UV rays, and catalyzes the ring-opening reaction of the epoxy ring.

Specific examples of the cationic polymerization catalyst are organic metal complex salts comprising at least one ligand (e.g. cyclopentadienyl anion, indenyl anion, (xylene) hexafluoroantimonate anion, hexafluorophosphate anion, etc.) and a metal cation (e.g. cation of iron, chromium, molybdenum, tungsten, manganese, rhenium, ruthenium, osmium, etc.), boron fluoride complexes, and the like.

The amount of the cationic polymerization catalyst is usually between 0.01 and 10 wt. % of the whole adhesive composition.

Heat-bonding Film Adhesive

The heat-bonding film adhesive is a thermosetting film-form adhesive consisting of the hot-melt coating film of the above adhesive composition, which has been activated by irradiation with UV rays. The heat-bonding film adhesive is an advantageous application form for a thermal adhesion type adhesive and solves the problems of the above described conventional hot-melt adhesives.

The heat-bonding film adhesive can thermally bond a pair of adherents by placing the film between the adherents and heat pressing them at a specific temperature. Furthermore, when the film is post-cured for a specific time, it displays good adhesion properties.

The curing reaction of the film proceeds at a temperature of 120° C. or higher and the film can exhibit sufficient adhesion strength (for example, 1 to 15 kg/25 mm or higher) by heating for a period of from 1 minute to 24 hours (heating during the thermocompressive adhering or in the post-cure). The curing reaction rate at 120° C. is moderate, but a sufficient curing time (for example, at least 10 hours) can achieve the desired adhesion properties. For reducing the curing time, the film can be heated at a temperature in the range between 130 and 300° C.

The heat-bonding film adhesive may be prepared as follows: First, an adhesive composition is melt-coated on a substrate to form a film-form precursor. Then, the film-form precursor is irradiated and activated with UV rays to obtain a heat-bonding film adhesive. The dose of the UV rays is usually between 100 and 10,000 mJ/cm$^2$ (an integrated dose at 360 nm).

The above substrate may be a liner, or one of adherents that will be bonded. The liner may be any conventional one, for example, a release paper, a release film, etc.

Melt coating is carried out at a temperature in the range between 60 and 150° C. For coating, any conventional coating means such as a knife coater, a die coater, and the like may be used. Alternatively, a film-form precursor may be produced by extrusion without using a substrate.

In general, the heat-bonding film adhesive is finished with protecting one or both adhesive surfaces with a liner. When the tackiness of the adhesive surfaces is relatively low, the film may be finished without a liner.

The thickness of the heat-bonding film adhesive is preferably between 0.001 and 5 mm, in particular between 0.005 and 0.5 mm. When the thickness is too low, the handling of the film may become difficult. When the thickness is too high, the effects become uneven in the thickness direction of the film, and thus the reliability of the film as a film adhesive may tend to decrease.

The heat-bonding film adhesive with the liners can be used as follows: First, the liners are removed from the film adhesive having the liners and sandwiched between the first and second adherents to form a laminate consisting of the first adherent, film adhesive, and second adherent, which are typically laminated in this order. Next, the laminate is heat-pressed at a temperature in the range between 80 and 300° C. under pressure in the range between 0.1 and 100 kg/cm$^2$ to form a bonded structure in which the three elements are closely bonded. This method can bond the two adherents with a sufficient adhesion strength in a time period of between 0.1 and 30 seconds.

Of course, the heat-bonding film adhesive of the present invention can exhibit a sufficient adhesion strength only by the above heat pressing. However, the film can be post-cured for the increase of the adhesion strength.

That is, after the above steps, the bonded structure is post-cured usually at a temperature of at least 120° C., preferably between 130 and 300° C. for a time period in the range between 1 minute and 24 hours. For the shortening of the post-curing time, preferable conditions include a temperature in the range between 140 and 200° C. and a time period in the range between 30 minutes and 1.2 hours. This method is one of the best embodiments of the adhering method using the heat-bonding film of the present invention.

Other Components

The adhesive composition of the present invention may contain various additives in addition to the above components, insofar as the effects of the present invention are not impaired. Examples of such additives are antioxidants, fillers, (e.g., inorganic fillers, conductive particles, etc.), lubricants such as waxes, rubber components, tackifiers, crosslinking agents, curing accelerators, colorants (e.g., pigments, dyes, etc.), and the like.

Applications

The adhesive composition and heat-bonding film adhesive according to the present invention are preferably used for adhering electronic parts, for example, adhering IC devices and printed circuit boards. Furthermore, they can be preferably used for adhering a pair of plastic articles such as polyamide, polyimide, polyetherimide, polycarbonate, polyethylene, polypropylene, polyester, and the like; and adhering a plastic article and an article made of other material (e.g., fibers, metals, semiconductive materials, such as silicon, ceramics, glasses, etc.). Specific examples of metals are copper, iron, nickel, gold, silver, aluminum, tungsten, molybdenum, platinum, and the like.

The production of the adhesive composition of the present invention includes no polymerization step using monomers as starting materials. Thus, the amount of unreacted monomers or volatile organic materials derived from the monomers can be decreased as much as possible. That is, it is possible to effectively suppress bubbling due to volatile materials that are generated during the solder reflow or monomer odors that are unpleasant to the users.

When the adhesive composition of the present invention is used in the form of an adhesive layer stuck on a substrate such as a plastic film, a fabric, a metal foil, etc., it can be used as an adhesive tape that can be heat bonded. Furthermore, the adhesive composition of the present invention can be used as a sealant besides the adhesive.

EXAMPLES

Example 1

An adhesive composition of this Example was prepared by mixing an ethylene-glycidyl methacrylate copolymer (BONDFAST CG 5001 available from Sumitomo Chemical Co., Ltd.; MFR=350 g/10 min., the weight ratio of ethylene units to glycidyl methacrylate units=82:12) (70 wt. parts), an ethylene-ethyl acrylate copolymer (NUC-EEA 6070 available from NIPPON UNICAR Co., Ltd.) (29.5 wt. parts) and a cationic polymerization catalyst ($Ar_2SSBF_6$ in which Ar is an aromatic functional group) (0.5 wt. part), with a kneading apparatus until the mixture became uniform. The mixing was carried out at 110° C. for 10 minutes.

Thermal Stability of Adhesive Composition

The adhesive composition of this Example was used as a sample, and its complex modulus $\eta^*$ (a measure for viscosity) was measured using a dynamic viscoelastometer (RDA II manufactured by RHEOMETRIX) at 120° C. and a shear rate of 6.28 rad/sec. with the original sample or after being heated for 2 hours. The original $\eta^*$ was 3,548 poise, while $\eta^*$ after 2 hours of heating was 3,794 poise. Thus, the increase rate was 8%. This result indicates that the composition is stable after 2 hours of heating and can be used in the continuous production method of articles without causing any problem in the forming step such as melt coating.

Formation of Heat-Bonding Film Adhesive

The mass of the adhesive composition of this Example was placed between a pair of polyethylene terephthalate (PET) films (release films) and passed through a knife gap heated at 140° C. A film-form precursor having a thickness of 0.1 mm was obtained.

The film-form precursor was irradiated with UV rays using a high pressure mercury lamp of 20 W/cm from a distance of 20 cm. A heat-bonding film adhesive was formed. The UV rays were irradiated at two doses of 630 mJ/cm$^2$ and 1,540 mJ/cm$^2$.

The storage moduli (G') of the film adhesive at various temperatures are shown in Table 1. The storage modulus was measured at each temperature with the sample of the heat-bonding film adhesive after 25 minutes from the UV ray irradiation by heating the sample from 80° C. to 280° C. at a heating rate of 5° C./min. and measuring the modulus at a shear rate of 6.28 rad/sec. For reference, the modulus of the heat-bonding film adhesive prior to the UV ray radiation (the precursor) is also shown in Table 1 (Reference Example).

The heat-bonding film adhesive was easily heat cured at a temperature of 120° C. or higher, and its storage modulus at 280° C. was 10$^6$ dyne/cm$^2$ or higher at any dose.

Adhesion Test

Using a heat-bonding film adhesive, which had been prepared by irradiating the above film-form precursor with UV rays at a dose of 330 mJ/cm$^2$, the adhesion test was carried out as follows.

A piece of the film adhesive (length of 30 mm, width of 10 mm and thickness of 0.1 mm) was inserted between a copper plate (length of 30 mm, width of 25 mm and thickness of 0.3 mm and a copper foil (length of 100 mm, width of 10 mm and thickness of 0.05 mm) with trueing up the edges of the film adhesive with those of the copper foil. Then, the laminate was thermally pressed at 180° C. under pressure of 30 kg/cm$^2$ for 10 seconds.

Then, the sample of the above laminate of the copper plate, heat-bonding film adhesive and copper foil was subjected to the 90 degree peeling test along the length of the copper foil. The peeling rate was 50 mm/min. The maximum value of peeling force (peeling at the interface between the copper foil and heat-bonding film adhesive) was used as the adhesion force. The result was 1.2 kg/cm, which means that the film adhesive had a sufficient adhesion strength.

Example 2

An adhesive composition of this Example was prepared in the same manner as in Example 1, except the weight ratio of the ethylene-glycidyl methacrylate copolymer to ethylene-ethyl acrylate copolymer to cationic polymerization catalyst was changed to 50:49.5:0.5 and a heat-bonding film adhesive of this Example was prepared in the same manner as in Example 1 using the adhesive composition of this Example. The dose of UV rays was 1,540 mJ/cm$^2$.

The storage modulus of this heat-bonding film adhesive was measured at each temperature in the same manner as in Example 1. The results are shown in Table 1.

Comparative Example 1

An adhesive composition of this Example was prepared in the same manner as in Example 1 except that no ethylene-ethyl acrylate copolymer was used, and the weight ratio of the ethylene-glycidyl methacrylate copolymer to cationic polymerization catalyst was 99.5:0.5 and a heat-bonding film adhesive of this Example was prepared in the same manner as in Example 1 using the adhesive composition of this Example. The dose of UV rays was 1,540 mJ/cm$^2$.

The storage modulus of this heat-bonding film adhesive was measured at each temperature in the same manner as in Example 1. The results are shown in Table 1.

The composition of this Comparative Example had insufficient adhesion properties after the irradiation of UV rays for use as a heat-bonding film adhesive, although it had good heat resistance and chemical stability.

Example 4

An adhesive composition of this Example was prepared in the same manner as in Example 1, except that cyclopentadienyliron(II) (xylene)hexafluoroantimonate was used as a cationic polymerization catalyst, and then a heat-bonding film adhesive of this Example was prepared in the same manner as in Example 1 using the adhesive composition of this Example. The film was irradiated with UV rays at two doses of 610 and 1,540 mJ/cm$^2$.

The storage modulus of this heat-bonding film adhesive was measured at each temperature in the same manner as in Example 1. The results are shown in Table 1.

The heat-bonding film adhesives of Examples 2, 3, and 4 were easily heat cured at a temperature of 120° C. or higher, and their storage moduli at 280° C. were all larger than 10$^6$ dyne/cm$^2$.

Example 5

A heat-bonding film adhesive of this Example was formed in the same manner as in Example 1, except that the film adhesive was stored at room temperature (about 25° C.) for 25 hours after the UV ray irradiation (at a dose of 1,540 mJ/cm$^2$).

The storage modulus of this heat-bonding film adhesive was measured in the same manner as in Example 1. The heat-bonding film adhesive of the present invention could be stably stored after the activation, and was easily heat cured at a temperature of 120° C. or higher. The storage modulus at 280° C. was larger than 10$^6$ dyne/cm$^2$.

Comparative Example 2

An adhesive composition of this Comparative Example was prepared in the same manner as in Example 1, except that an ethylene-acrylate ester-maleic anhydride copolymer (BONDINE HX 8210 available from Sumitomo Atochem Co., Ltd.) (50 wt. parts), the ethylene-glycidyl methacrylate copolymer used in Example 1 (BONDFAST CG 5001) (50 wt. parts) and diallyl phthalate (a crosslinking agent) (1 wt. part) were used. When this adhesive composition was heated at 120° C., it gelled within 30 minutes. This is because the thermal crosslinking reaction with the above crosslinking agent easily proceeds at 120° C.

TABLE 1

| Dose of UV rays (mJ/cm$^2$) | Storage modulus G' (dyne/cm$^2$) at a temperature of | | | | |
|---|---|---|---|---|---|
| | 120° C. | 160° C. | 200° C. | 240° C. | 280° C. |
| Ref. Ex. 0 | 3.5 × 10$^3$ | 6.0 × 10$^2$ | 2.8 × 10$^4$ | 2.6 × 10$^6$ | 1.7 × 10$^7$ |
| Ex. 1  630 | 1.0 × 10$^6$ | 4.9 × 10$^6$ | 6.0 × 10$^6$ | 7.5 × 10$^6$ | 9.0 × 10$^6$ |
| 1540 | 2.0 × 10$^6$ | 3.1 × 10$^7$ | 3.3 × 10$^7$ | 4.2 × 10$^7$ | 5.7 × 10$^7$ |
| Ex. 2  1540 | 1.4 × 10$^6$ | 2.8 × 10$^6$ | 2.9 × 10$^6$ | 2.9 × 10$^6$ | 2.8 × 10$^6$ |
| Ex. 3  1540 | 4.6 × 10$^6$ | 1.3 × 10$^8$ | 1.2 × 10$^8$ | 17 × 10$^8$ | 2.3 × 10$^8$ |
| Ex. 4  610 | 6.6 × 10$^3$ | 3.6 × 10$^3$ | 1.3 × 10$^5$ | 3.6 × 10$^6$ | 1.2 × 10$^7$ |
| 1540 | 1.4 × 10$^4$ | 9.0 × 10$^4$ | 1.1 × 10$^7$ | 8.0 × 10$^6$ | 1.8 × 10$^7$ |

TABLE 1-continued

| | Dose of UV rays (mJ/cm²) | Storage modulus G' (dyne/cm²) at a temperature of | | | | |
|---|---|---|---|---|---|---|
| | | 120° C. | 160° C. | 200° C. | 240° C. | 280° C. |
| Ex. 5 | 1540 | $7.0 \times 10^6$ | $3.1 \times 10^7$ | $5.3 \times 10^7$ | $6.3 \times 10^7$ | $7.2 \times 10^7$ |

What is claimed is:

1. A thermosetting hot-melt adhesive composition comprising:
    an epoxy component comprising a polyethylene copolymer having epoxy groups;
    a cationic polymerization catalyst; and
    a thermoplastic polymer having no epoxy groups, comprising an ethylene-alkyl acrylate copolymer.

2. The composition of claim 1, wherein the epoxy component comprises about 40–80 weight % of the whole weight of the composition.

3. The composition of claim 1, wherein the epoxy component comprises about 45–75 weight % of the whole weight of the composition.

4. The composition of claim 1, wherein the thermoplastic polymer having no epoxy groups comprises about 15–55 weight % of the whole weight of the composition.

5. The composition of claim 1, wherein the thermoplastic polymer having no epoxy groups comprises about 24–50 weight % of the whole weight of the composition.

6. The composition of claim 1, wherein melt flow rate at 190° C. of the epoxy component is about 10 g/10 min. to about 700 g/10 min.

7. The composition of claim 1, wherein total amount of the epoxy component and the thermoplastic polymer having no epoxy groups is about 50–99.9 weight % of the whole weight of the composition.

8. The composition of claim 1, wherein the cationic polymerization catalyst comprises about 0.01–10 weight % of the whole weight of the composition.

9. The composition of claim 1, wherein the storage modulus of the composition is at least $10^6$ dynes/cm² at 280° C.

* * * * *